United States Patent [19]

Callahan

[11] Patent Number: 5,525,921

[45] Date of Patent: Jun. 11, 1996

[54] LOGIC SUPPRESSION OF INPUT AND GROUND SPIKES FOR SYNCHRONIZED INPUTS

[75] Inventor: John M. Callahan, Fremont, Calif.

[73] Assignee: VLSI Technology, Inc., San Jose, Calif.

[21] Appl. No.: 224,450

[22] Filed: Apr. 7, 1994

[51] Int. Cl.[6] .................................................. H03K 5/00
[52] U.S. Cl. ........................... 327/144; 327/141; 327/202; 327/217; 327/291
[58] Field of Search ..................................... 327/141, 144, 327/153, 154, 161, 162, 171, 172–176, 291–296, 202, 203, 217

[56] References Cited

U.S. PATENT DOCUMENTS

| | | | |
|---|---|---|---|
| 3,942,124 | 3/1976 | Tarczy-Hornoch | 327/141 |
| 4,224,531 | 9/1980 | Ebihara et al. | 327/153 |
| 4,418,418 | 11/1983 | Aoki | 327/144 |
| 4,525,635 | 6/1985 | Gillberg | 327/161 |
| 4,979,194 | 12/1990 | Kawano | 327/172 |
| 5,001,374 | 3/1991 | Chang | 327/141 |
| 5,187,385 | 2/1993 | Koike | 327/203 |
| 5,225,715 | 7/1993 | Mori et al. | 327/176 |
| 5,305,451 | 4/1994 | Chao et al. | 327/144 |

*Primary Examiner*—Timothy P. Callahan
*Assistant Examiner*—T. Lam
*Attorney, Agent, or Firm*—Patrick T. King

[57] ABSTRACT

A synchronizing means is provided for synchronizing an asynchronous interrupt signal to a synchronous clock signal for a computer system or the like. The synchronizing means includes a plurality of latch subsystems, where each of the latch subsystems has a sample input terminal for receiving a synchronous clock signal and a hold terminal for receiving a complementary synchronous clock signal. Set logic means are provided for generating a set output signal in response to certain predetermined output signals of the synchronizing means having a predetermined relationship therebetween, which occurs when an input interrupt signal has a duration greater than 1.5 periods of the synchronous clock signal. The set logic means includes AND gates and OR gates. Reset logic means are provided for generating a reset output signal. The reset logic means includes AND gates and OR gates.

4 Claims, 9 Drawing Sheets

5,525,921

LOGIC SUPPRESSION OF INPUT AND GROUND SPIKES FOR SYNCHRONIZED INPUTS

BACKGROUND OF THE INVENTION

1. Field of the Invention

This invention relates to logic circuits and, more particularly, to techniques for making interrupt signals insensitive to spurious input signals and ground spikes.

2. Prior Art

An interrupt condition in a computer system is a suspension of a process, such as the execution of a computer program. An interrupt condition normally is caused by an event external to that process and the suspension of the process is performed in such a way that the process can be resumed. A synchronous interrupt operation for a computer system is an operation where an external interrupt signal is processed through a series of latches to synchronize the interrupt to the timing of the computer system. An interrupt signal commonly goes from a ONE level to a ZERO level to indicate the presence of an interrupt condition.

A problem to be solved is how to make input signal lines for an interrupt signal insensitive to voltage spikes on the input signal line or ground spikes on the ground lines. A signal with a TTL minimum ONE level of 2.0 volts can be detected as a ZERO level by an input circuit with a high enough ground spike. Ground spikes as high as 2.0 volts and as wide as 30 nanoseconds have been observed, sufficient to falsely trigger an interrupt signal line. Noisy circuit boards can also produce negative-going spikes on the input signal lines to integrated-circuit computer chips on the circuit board. The result of these spikes on the input and ground lines is to erroneously indicate to a computer chip that it is to be interrupted.

The synchronizing logic circuitry for a conventional interrupt signal synchronizing system typically is sensitive to level changes only. This does not prevent a short-duration GROUND SPIKE signal from being interpreted and processed as a valid interrupt signal.

One technique for dealing with ground spikes is to raise the minimum ONE level for the circuit to a level which is above the standard 2.0 volt level for TTL circuits. However, this makes the circuit incompatible with conventional TTL standards.

Consequently, the need has arisen for a technique to protect input circuits for synchronizing interrupt signals from being falsely triggered by spikes on their input signal lines and ground lines.

SUMMARY OF THE INVENTION

It is therefore an object of the invention to make circuits for synchronizing external control signals insensitive to input signal spikes and ground spikes using logic circuits.

In accordance with this and other objects of the invention, an improved system is provided for qualifying and synchronizing an asynchronous input interrupt signal with a synchronous clock signal for an electronic system such as, for example, a computer system. A synchronizing means is provided for synchronizing an asynchronous interrupt signal to a synchronous clock signal for the computer system. One instance of a synchronizing means includes a plurality of latch subsystems, each of said latch subsystems having a sample input terminal for receiving a synchronous clock signal and a hold terminal for receiving a complementary synchronous clock signal.

Set logic means are provided for generating a set output signal in response to certain predetermined output signals of the synchronizing means having a predetermined relationship therebetween, which occurs when an input interrupt signal has a duration greater than 1.5 periods of the synchronous clock signal. The set logic means includes AND gates and NOR gates.

Reset logic means are provided for generating a reset output signal. The reset logic means includes AND gates and NOR gates.

Flip-flop means provide a synchronized output interrupt signal corresponding to the input interrupt signal. The flip-flop means includes a pair or cross-coupled logic gates formed of, for example, cross-coupled logic gates, including NOR gates and NAND gates.

Each latch subsystems include a latch input terminal, a first transmission gate, having an input terminal connected to a latch input terminal, having an output terminal, and having a control terminal connected to the first output terminal of the clock signal source. Each latch has a first, series inverter having an input terminal connected to the output terminal of the first transmission gate and having an output terminal. A second, feedback inverter has an input terminal connected to the output terminal of the first, series inverter and has an output terminal. A second transmission gate has an input terminal connected to the output terminal of the second feedback inverter and has an output terminal connected to the input terminal of the first inverter. A control terminal is connected to the second output terminal of the clock signal source.

A method of qualifying and synchronizing a asynchronous interrupt signal with a synchronous clock signal for a computer system includes the steps of synchronizing an asynchronous interrupt signal to a synchronous clock for the computer system; generating a set output signal at an output terminal thereof in response to said predetermined signals having a "predetermined" relationship therebetween; generating a reset output signal in response to said predetermined signals having a predetermined. relationship therebetween; and providing a synchronized output interrupt signal corresponding to the input interrupt signal flip-flop means.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that these examples are not intended to limit the invention to these embodiments. On the contrary, the invention is intended to cover alternatives, modifications and equivalents, which may be included within the spirit and scope of the invention as defined by the appended claims.

Figure 1:
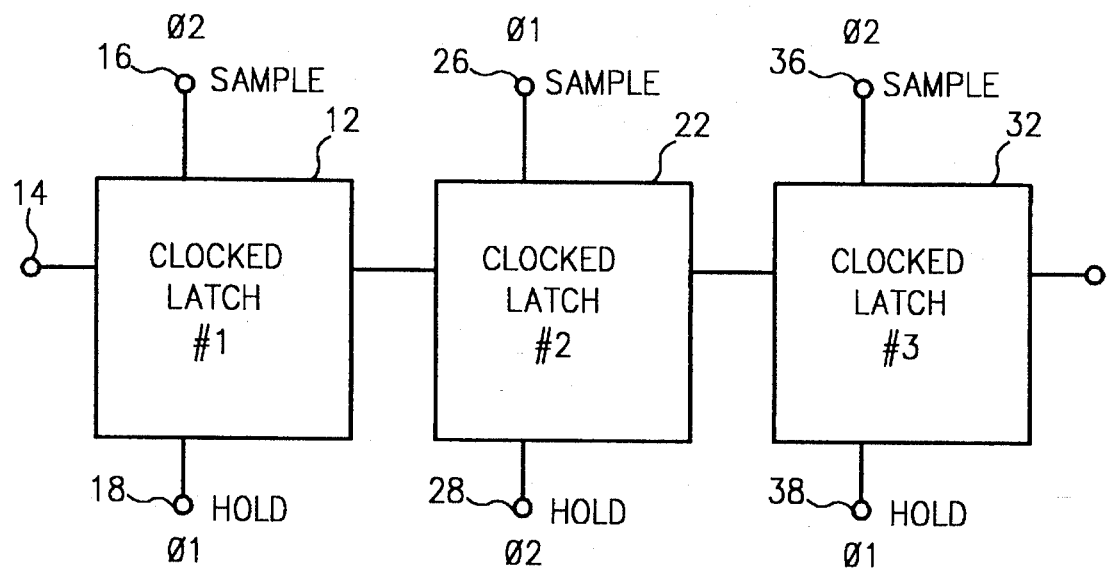
FIG. 1 is a block diagram of prior art logic circuitry for synchronizing an interrupt input signal for a microprocessor.

FIG. 1 illustrates a block diagram of logic circuitry for an illustrative conventional prior art system 10 for synchronizing the timing of an interrupt input signal used with, for example, a computer system. As described herein below, this circuitry has the problem of being sensitive to short-duration input signal spikes and ground spikes. The clock signals Ø1 and Ø2 for timing this system are complementary, non-overlapping, square-wave clock signals having opposite phases, as illustrated in FIG. 2.

With reference to FIG. 1, a first clocked latch circuit 12 has a signal input terminal 14 at which is provided an interrupt signal. The interrupt signal is normally at a LOW level and goes to a HIGH level to indicate that an interrupt function is required to be executed. A SAMPLE terminal 16 has the clock signal Ø2 applied thereto. A HOLD terminal 18 has the clock signal Ø1 applied thereto. The latch circuit 12 holds the level of the signal present at the input terminal 14 for the duration of the positive phase of the Ø1 clock signal. The output terminal of the first clocked latch circuit 12 is connected to an input terminal of a second clocked latch circuit 22. A SAMPLE terminal 26 has the clock signal Ø1 applied thereto. A HOLD terminal 28 has the clock signal Ø2 applied thereto. The latch circuit 22 holds the level of the signal present at the input terminal of latch 22 for the duration of the positive phase of the Ø2 clock signal. The output terminal of the second clocked latch circuit 22 is connected to an input terminal of a third clocked latch circuit 32. A SAMPLE terminal 36 has the clock signal Ø2 applied thereto. A HOLD terminal 38 has the clock signal Ø1 applied thereto. The latch circuit 32 holds the level of the signal present at the input terminal of latch 32 for the duration of the positive phase of the Ø1 clock signal.

Figure 2:
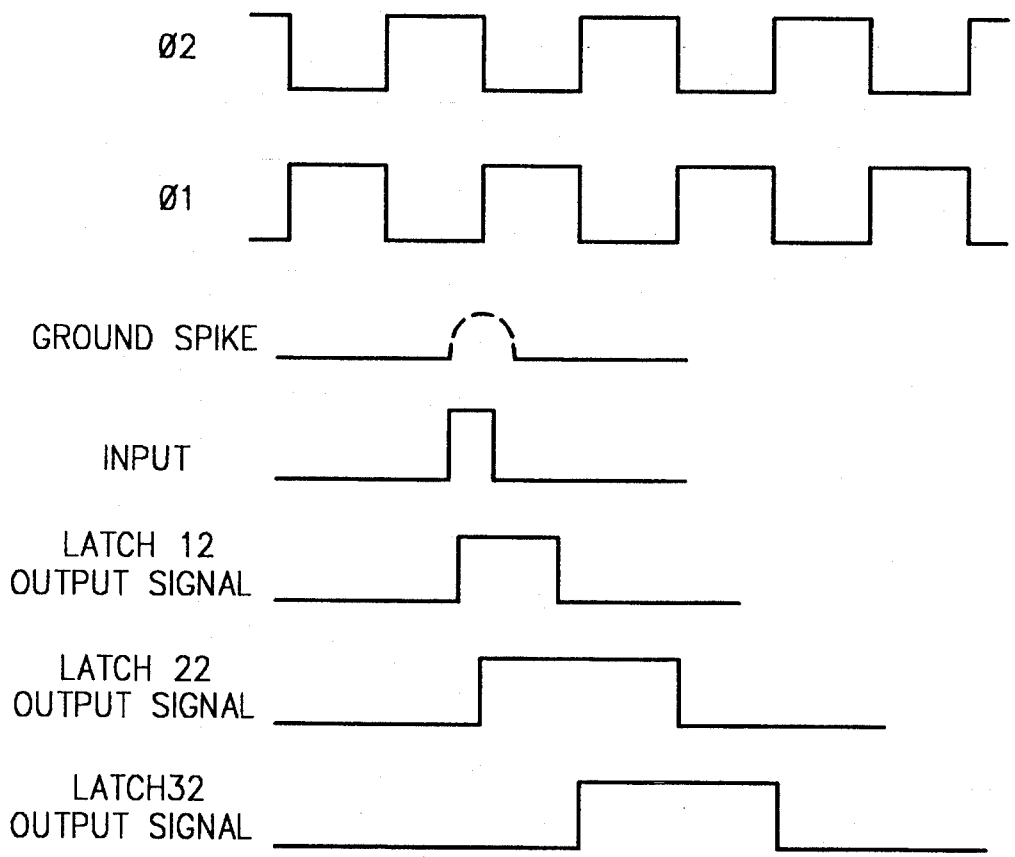
FIG. 2 is a timing diagram illustrating the effect of a ground spike on the prior art logic circuitry of FIG. 1.

FIG. 2 is a timing diagram illustrating the effect of a ground spike on the logic circuits, of the conventional interrupt-signal synchronizing system 10 of FIG. 1. The complementary, non-overlapping, square-wave clock signals Ø1 and Ø2 have opposite phases as shown. Signal wave forms are shown for: the square-wave clock signals Ø1 and Ø2, a ground spike, the input signal, the output signal of the first clocked latch circuit 12, the output signal of the second clocked latch circuit 22, and the output signal of the third clocked latch circuit 32.

The result of A GROUND SPIKE signal is shown occurring on the INPUT SIGNAL line. The GROUND SPIKE occurs while the sample signal Ø2 for the first CMOS clocked latch circuit 12 is still HIGH so that the HIGH state of the INPUT SIGNAL is sampled by the first clocked latch circuit 12. If the input signal remains HIGH when the positive phase of the HOLD signal Ø1 for the first clocked latch circuit 12 goes HIGH, the HIGH state of the input signal is latched to the output terminal of the first clocked latch circuit 12 and provides a HIGH output signal level on the LATCH 12 OUTPUT SIGNAL LINE. In a similar manner, the LATCH 12 OUTPUT SIGNAL is sampled by the SAMPLE clock signal Ø1 of the second clocked latch circuit 22. This signal is then latched into the second clocked latch circuit 22 by the HOLD clock signal Ø2 at the Hold terminal 28 of the second clocked latch circuit 22 and provides a HIGH output signal level on the LATCH 22 OUTPUT SIGNAL line. Finally, the LATCH 22 OUTPUT SIGNAL is sampled by the SAMPLE clock signal Ø2 of the third clocked latch circuit 32. This signal is then latched into the third clocked latch circuit 32 by the HOLD clock signal Ø1 at the Hold terminal 38 of the third clocked latch circuit 32 to provide a HIGH output signal line on LATCH 32 OUTPUT SIGNAL line.

The synchronizing logic circuitry for the conventional interrupt signal synchronizing system 10 does not prevent the GROUND SPIKE signal from being interpreted, synchronized, and later processed as a valid interrupt signal. Similarly, spikes on the input signal line to an interrupt signal synchronizing system can cause false triggering.

Figure 3:
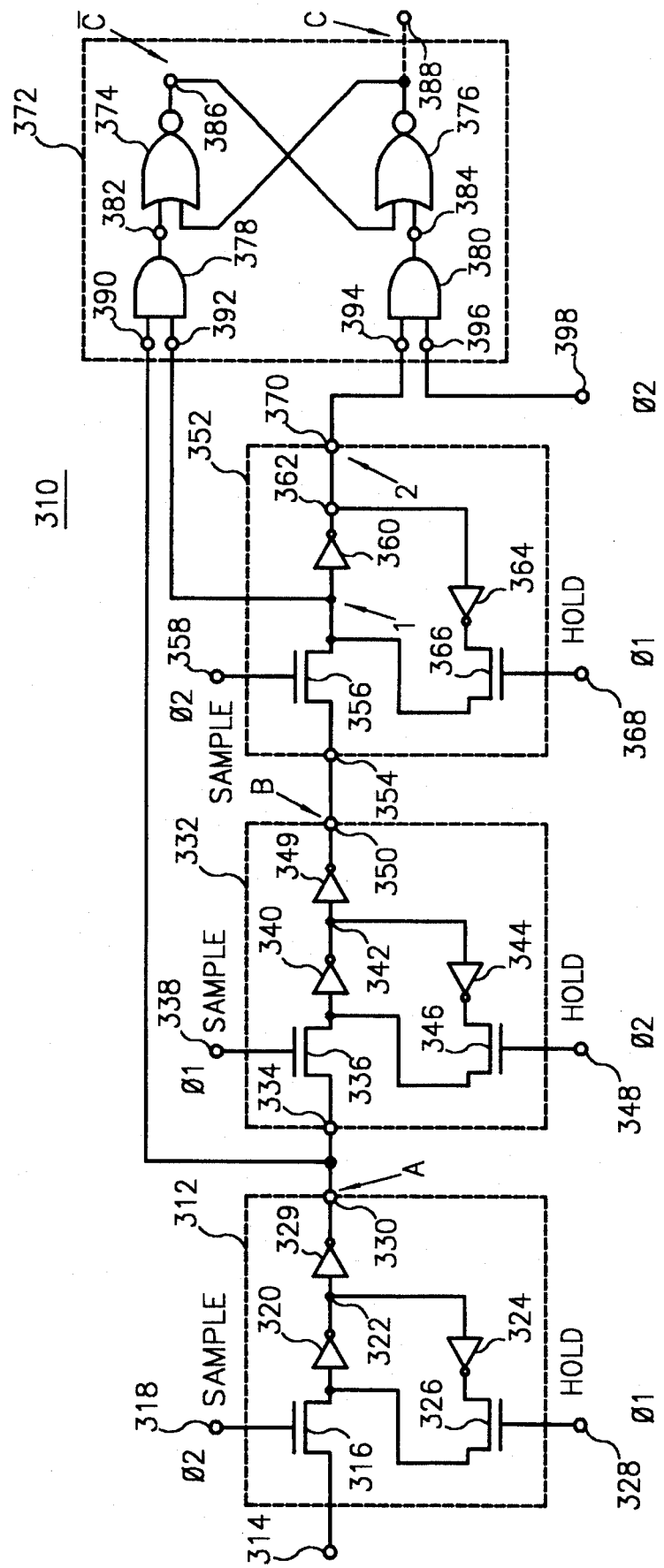
FIG. 3 is a block diagram of logic circuitry which uses logic gates and an RS flip-flop formed of cross coupled NOR gates for synchronizing an interrupt input signal according to the invention.
Figure 4:
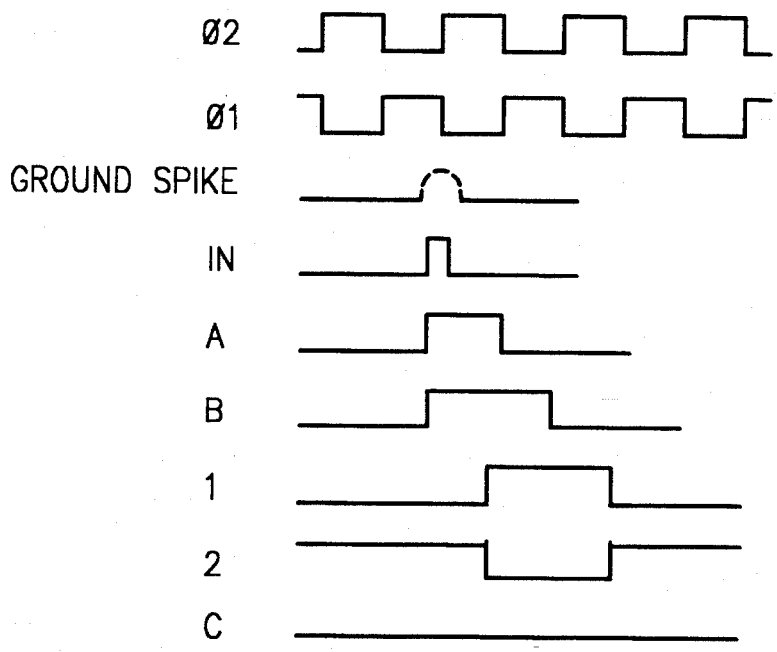
FIG. 4 is a timing diagram illustrating the effect of a ground spike on the logic circuitry of FIG. 3 according to the invention.

FIG. 3 shows logic circuitry according to the invention for an improved system 310 for synchronizing an interrupt input signal to avoid the effect of short duration spikes. FIG. 4 shows the clock signals Ø1 and Ø2 for the system, which are complementary, non-overlapping square-wave clock signals having opposite phases, as shown.

With reference to FIG. 3, a first CMOS clocked latch circuit 312 has a signal input terminal 314 at which is provided an interrupt signal. The interrupt input signal is normally at a LOW level. Note that in this and other embodiments of the invention, appropriate inverter circuits can be used to modify the logic sense of an interrupt signal, as required. The interrupt signal goes to a HIGH level to indicate that an interrupt operation is required. A first transmission-gate transistor 316 has an input terminal connected to the signal input terminal 314. A control terminal for the first transmission-gate transistor 316 is connected to a SAMPLE terminal 318 for the first CMOS clocked latch circuit 312. The SAMPLE terminal 318 has the clock signal Ø2 applied thereto. The first transmission gate transistor 316 has an output terminal which is connected to an input terminal of a first inverter 320. The first inverter 320 has an output terminal which is connected to a terminal 322. A second feedback inverter 324 has an input terminal connected to the output terminal 322. An output terminal of the second inverter 324 is connected to an input terminal of a second transmission-gate transistor 326. An output terminal of the second inverter 324 is connected through a second transmission gate transistor 326 back to the output terminal of the first transmission-gate transistor 316, as shown in the Figure. A control terminal for the second transmission-gate transistor 326 is connected to a HOLD terminal 328 for the first CMOS clocked latch circuit 312. The HOLD terminal 328 has the clock signal Ø1 applied thereto.

During the HIGH half of its cycle, the square-wave clock signal Ø2 opens the first transmission-gate transistor 316 to the level of the signal at the input terminal 314 during the time that the clock signal Ø2 is at a HIGH level. During the time that the clock signal Ø2 is high, the clock signal Ø1 is LOW so that the second transmission-gate transistor 326 is off. This prevents the output signal of the series inverter 324 from passing through the transmission-gate transistor 326 and interfering with the input signal to the first inverter 320. During the subsequent LOW half of its cycle, the square-wave clock signal Ø2 closes the first transmission-gate transistor 316 so that the input terminal to the first inverter 320 is isolated from the input terminal 314 of the CMOS clocked latch circuit 312. During the time that the square-wave clock signal Ø2 is LOW, the complementary square-wave clock signal Ø1 is HIGH. During the time that the Ø1 signal is HIGH, the inverse of the signal level at the terminal 322 of the latch 312 passes through the transmission-gate transistor 326 and appears at the input terminal of the first inverter 320. When the second transmission-gate transistor 326 is on, the first inverter 320 and the second inverter 324 function as a cross-coupled latch circuit. Thus, the level of the output signal at the terminal 322 is stored, or latched, until the next phase of the clock signals. The level of the signal at the input terminal immediately prior to the clock signal Ø2 curing off the first transmission-gate transistor 316 is held in the latch circuit 312 for the duration of the positive phase of the Ø1 clock signal. The terminal 322 is connected to an input terminal of an output inverter 329 which has an output terminal connected to an output terminal 330 of the first CMOS clocked latch circuit 312. This provides a latched output signal at terminal 330 which has the same polarity as the input signal at terminal 314.

FIG. 3 additionally shows a block representing a second CMOS clocked latch circuit 332. The second CMOS clocked latch circuit 332 has the same internal circuitry as the first CMOS clocked latch circuit 312. The second CMOS clocked latch circuit 332 has a signal input terminal 334 which is connected to the output terminal 330 of the first CMOS clocked latch circuit 312 and at which is provided a latched interrupt signal from the first CMOS clocked latch circuit 312. A first transmission-gate transistor 336 has an input terminal connected to the signal input terminal 334. A control terminal for the first transmission-gate transistor 336 is connected to a SAMPLE terminal 338 which has the clock signal Ø1 applied thereto. The first transmission gate 336 has an output terminal which is connected to an input terminal of a first inverter 340. The inverter 340 has an output terminal which is connected to a terminal 342 of the second CMOS clocked latch circuit 332. A second inverter 344 has an input terminal connected to the terminal 342. An output terminal of the second inverter 344 is connected to an input terminal of a second transmission-gate transistor 346.

An output terminal of the second inverter 344 is connected back through a second transmission-gate transistor 346 to the output terminal of the first transmission-gate transistor 336. A control terminal for the second transmission-gate transistor 346 is connected to a HOLD terminal 348 which has the clock signal Ø2 applied thereto.

During the HIGH half of its cycle, the square-wave clock signal Ø1 opens the first transmission-gate transistor 336 and passes the level of the signal at the input terminal 334 during the time that the clock signal Ø1 is at a HIGH level. During the time that the clock signal Ø1 is high, the clock signal Ø2 is LOW so that the second transmission-gate transistor 346 is off. This prevents the output signal of the series inverter 344 from passing through and interfering with the input signal to the first, series inverter 340. During the subsequent LOW half of its cycle, the square-wave clock signal Ø1 closes the first transmission-gate transistor 336 so that the input terminal to the first inverter 340 is isolated from the input terminal 334 of the second CMOS clocked latch circuit 332. During the time that the square-wave clock signal Ø1 is LOW, the complementary square-wave clock signal Ø2 is HIGH. During the time that the Ø2 is HIGH, the inverse of the signal level at the output terminal 342 of the latch 332 passes through transmission-gate transistor 346 and appears at the input terminal of the first, series inverter 340. When the second transmission-gate transistor 346 is on, the first, series inverter 340 and the second inverter 344 function as a cross-coupled latch circuit.

The level of the output signal at the output terminal 342 is stored, or latched, until the next phase of the clocks. The level of the signal at the input terminal immediately prior to the clock signal Ø1 cutting off the first transmission-gate transistor 336 is held in the latch circuit 312 for the duration of the positive phase of the Ø2 clock signal. The terminal 342 is connected to an input terminal of an output inverter 349 which has an output terminal connected to an output terminal 350 of the second CMOS clocked latch circuit 332.

FIG. 3 also shows a block representing a third CMOS clocked latch circuit 352. The second CMOS clocked latch circuit 352 has the same internal circuitry as the first and second CMOS clocked latch circuits 312, 332. The third CMOS clocked latch circuit 352 has a signal input terminal 354 at which is provided a latched interrupt signal from the second CMOS clocked latch circuit 332. The latched interrupt signal is normally at a LOW level and goes to a HIGH level to indicate that an interrupt is required. A first transmission-gate transistor 356 has an input terminal connected to the signal input terminal 354. A control terminal for the first transmission-gate transistor 356 is connected to a SAMPLE terminal 358 which has the clock signal Ø2 applied thereto. The first transmission gate 356 has an output terminal which is connected to an input terminal of a first inverter 360. The first inverter 360 has an output terminal which is connected to a terminal 362. A second inverter 364 has an input terminal connected to the output terminal 362. An output terminal of the second inverter 364 is connected to an input terminal of a second transmission-gate transistor 366. An output terminal of the second inverter 364 is connected back to the output terminal of the first transmission-gate transistor 356. A control terminal for the second transmission-gate transistor 366 is connected to a HOLD terminal 368 which has the clock signal Ø1 applied thereto.

During the HIGH half of its cycle, the square-wave clock signal Ø2 opens the first transmission-gate transistor 356 and passes the level of the signal at the input terminal 354 during the time that the clock signal Ø2 is at a HIGH level. During the time that the clock signal Ø2 is high, the clock signal Ø1 is LOW so that the second transmission-gate transistor 366 is off. This prevents the output signal of the inverter 364 from passing through and interfering with the input signal to the first inverter 360. During the subsequent LOW half of its cycle, the square-wave clock signal Ø2 closes the first transmission-gate transistor 356 so that the input terminal to the first inverter 360 is isolated from the input terminal 354 of the second CMOS clocked latch circuit 352. During the time that the square-wave clock signal Ø2 is LOW, the complementary square-wave clock signal Ø1 is HIGH. During the time that the square-wave clock signal Ø1 is HIGH, the inverse of the signal level at the output terminal 362 of the latch 352 appears at the input terminal of the first inverter 360. When the second transmission-gate transistor 366 is on, the first inverter 360 and the second inverter 364 function as a cross-coupled latch circuit. The level of the output signal at the output terminal 362 is stored, or latched, until the next phase of the clocks. The level of the signal at the input terminal immediately prior to the clock signal Ø2 cutting off the first transmission-gate transistor 356 is held in the latch circuit 332 for the duration of the positive phase of the Ø1 clock signal. The terminal 362 is connected to an output terminal 370 of the third CMOS clocked latch circuit 352.

Note that for definition purposes, setting a latch circuit means setting it to the TRUE condition, which could be a ZERO or a ONE. The input signal that does this is called the SET signal if the set requirement is a ONE level, and SET if the set requirement is a ZERO level.

FIG. 3 also shows a logic circuit 372 which includes an RS flip-flop latch circuit formed of a pair of cross-coupled NOR gates 374, 376. A set logic subcircuit is provided by an AND gate 378. A reset logic subcircuit is provided by an AND gate 380. The RS flip-flop has a SET input terminal 382 which is connected to the output terminal of the AND gate 378. The RS flip-flop circuit has a RESET input terminal 384 which is connected to the output terminal of the AND gate 380. The logic circuit 372 includes an inverted OUTPUT terminal 386 and an OUTPUT terminal 388.

The AND gate 378 has a first input terminal 390 connected to the "A" output terminal 330 of the first CMOS clocked latch circuit 312. The AND gate 392 has a second input terminal 392 which is connected to the "1" output terminal of the first transmission-gate transistor 356 of the third CMOS clocked latch circuit 352.

The AND gate 380 has a first input terminal 394 connected to the output terminal 370 of the third CMOS clocked latch circuit 352. The AND gate 380 has a second input terminal 396 which is connected to Ø2 clock signal.

For the latch 374, 376 to be put into the SET state such that the C terminal 388 goes to a HIGH state, two LOW signals must both appear at the input terminals of the NOR gate 376. This occurs when the output terminal 386 of the NOR gate 374 is LOW, and terminal 384 is LOW. Terminal 384 is LOW when either signal 2 at terminal 394 is LOW or Ø2 signal at terminal 398 is LOW, or both are low. The output terminal 386 of the NOR gate 374 goes LOW when terminal 382 goes to a HIGH state, which is caused by both signals A and 1 being simultaneously in a HIGH state. This requires that the input signal on signal input terminal 314 be in the HIGH state for a minimum time. This prevents a short-duration spike on the input signal line from being interpreted and processed as a valid interrupt signal.

For the latch 374, 376 to be put into the RESET state, such that the C terminal 388 goes to a LOW state, at least one HIGH signal must appear at the input terminals of the NOR gate 376. This occurs when the output terminal of the AND gate 380 goes HIGH, which is caused by a HIGH signal 2 at the output terminal 370 of the third latch 352 and the HIGH phase of the Ø2 signal at terminal 396. A HIGH signal 2 at the output terminal 370 of the third latch 352 occurs when the signal 1 is at a LOW state.

FIG. 4 is a timing diagram illustrating the effect of a ground spike on the logic circuitry of FIG. 3. Signal waveforms are shown for: the square-wave clock signals Ø1 and Ø2, the ground spike, the system input signal (IN) at terminal 314, the output signal (A) at terminal 330 of the first CMOS clocked latch circuit 312, the output signal (B) at the terminal 350 of the second CMOS clocked latch circuit 332, the signal (1) at the output terminal of the transmission-gate transistor 356, the output signal (2) at terminal 370 of the third CMOS clocked latch circuit 352, and the system output signal (C) at terminal 388. The complementary, non-overlapping, square-wave clock signals Ø1 and Ø2 have opposite phases as shown.

The result of a ground spike signal is shown occurring on the input signal IN line. The spike occurs while the Sample signal Ø2 for the first CMOS clocked latch circuit 312 is HIGH so that the HIGH state of the spike is latched in the first CMOS clocked latch circuit 312. As soon as the spike signal rises above the HIGH threshold level at the input terminal of the inverter 320, a signal A with a logic HIGH level is provided at the terminal 330 of the first CMOS clocked latch circuit 312. If the input signal is HIGH when the positive phase of the HOLD signal Ø1 for the first CMOS clocked latch circuit 312 is HIGH, the HIGH state of the spike signal is latched by the first CMOS clocked latch circuit 312. Note that when the next Sample signal Ø2 for the first CMOS clocked latch circuit 312 goes HIGH, the input signal line is at a LOW state, which state is latched into the first CMOS clocked latch circuit 312 and which appears as a LOW state at output terminal 330.

The signal A at terminal 330 is sampled by the clock signal Ø1 at terminal 334 of the second CMOS clocked latch circuit 332. The signal at terminal 330 is then latched into the second CMOS clocked latch circuit 332 by the clock signal Ø2 at the HOLD terminal 348 of the second CMOS clocked latch circuit 332.

Finally, the signal B at terminal 350 is sampled by the clock signal Ø2 in the third CMOS clocked latch circuit 352. The B signal at terminal 350 is then latched into the third CMOS clocked latch circuit 352 by the clock signal Ø1 at the HOLD terminal 368 of the third CMOS clocked latch circuit 52. The signal 1 at the output terminal of the transmission-gate transistor 356 appears in inverted form as signal 2 at terminal 370.

The latch output signal is not set when the input signal at terminal 314 is less than 0.5 clock period of the synchronous clock signal applied to the computer system to be interrupted, because then the signals produced at signals 1 and A do not overlap so that the set signal at terminal 382 remains zero.

The system 310 prevents the ground spike signal from being interpreted and processed as a valid interrupt signal.

Figure 5:
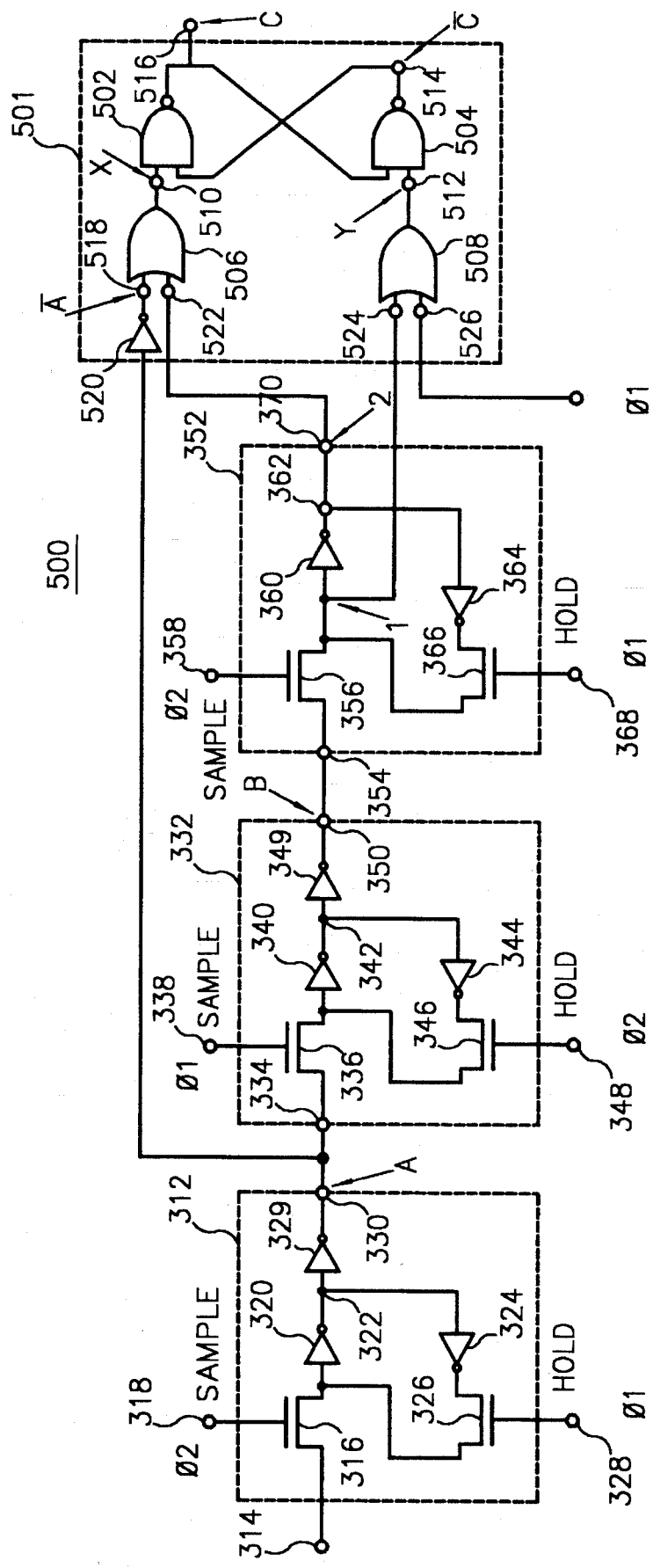
FIG. 5 is a block diagram of an alternative embodiment of logic circuitry for synchronizing an interrupt input signal which uses logic gates and an RS flip-flop circuit which is formed of a pair of cross-coupled NAND gates for synchronizing an interrupt input signal according to the invention.

FIG. 5 is a block diagram of an alternative embodiment of logic circuitry for an improved system 500 for synchronizing an interrupt input signal to avoid short duration ground spikes according to the invention. The system 500 includes an RS flip-flop circuit which is formed of a pair of cross-coupled NAND gates for synchronizing an interrupt input signal, according to the invention.

FIG. 5 shows logic circuit 500 which includes the first, second, and third CMOS clocked latch circuits 312, 332, 352, which are the same as the latch circuits of FIG. 3. The logic circuit 500 also includes an alternative RS flip-flop latch circuit formed of a pair of cross-coupled NAND gates 502, 504. A $\overline{\text{SET}}$ logic circuit is provided by an OR gate 506. A $\overline{\text{RESET}}$ logic circuit is provided by an OR gate 508. The RS flip-flop circuit 500 has a $\overline{\text{SET}}$ input terminal 510 which is connected to the output terminal of tile OR gate 506. The RS flip-flop circuit 501 has a $\overline{\text{RESET}}$ input terminal 512 which is connected to the output terminal of the OR gate 508. The RS flip-flop latch circuit 501 includes an INVERTED OUTPUT terminal 514 and an OUTPUT terminal 516.

The OR gate 506 has first input terminal 518 connected to the output terminal of an inverter 520. The input terminal of the inverter 520 is connected to the output terminal of the first CMOS clocked latch circuit 312. The OR gate 506 has a second input terminal 522 which is connected to the output terminal of the third CMOS clocked latch circuit 352.

The OR gate 508 has first input terminal 524 connected to the output of the first transmission-gate transistor 356 of the third CMOS clocked latch circuit 352. The OR gate 508 has a second input terminal 526 which is connected to Ø1 clock signal.

For the latch 502, 504 to be put into the SET state such that the C terminal 516 goes to a HIGH state, a LOW signal must appear at the x input terminal 510 of the NAND gate 502. This occurs when the output terminal of the NOR gate 506 is LOW, caused by signal 2 being LOW and signal A being HIGH. This requires that the input signal at terminal 314 be in the HIGH state for a minimum time. This prevents a short-duration spike on the input signal line from being interpreted and processed as a valid interrupt signal.

For the latch 502, 504 to be put into the RESET state, such that the C terminal 516 goes to a LOW state, a LOW signal must appear at the y input terminal 512 of the NAND gate 504. This occurs when the output terminal of the NOR gate 508 is LOW, caused by signal 1 being LOW and the Ø1 clock signal being LOW.

Figure 6:
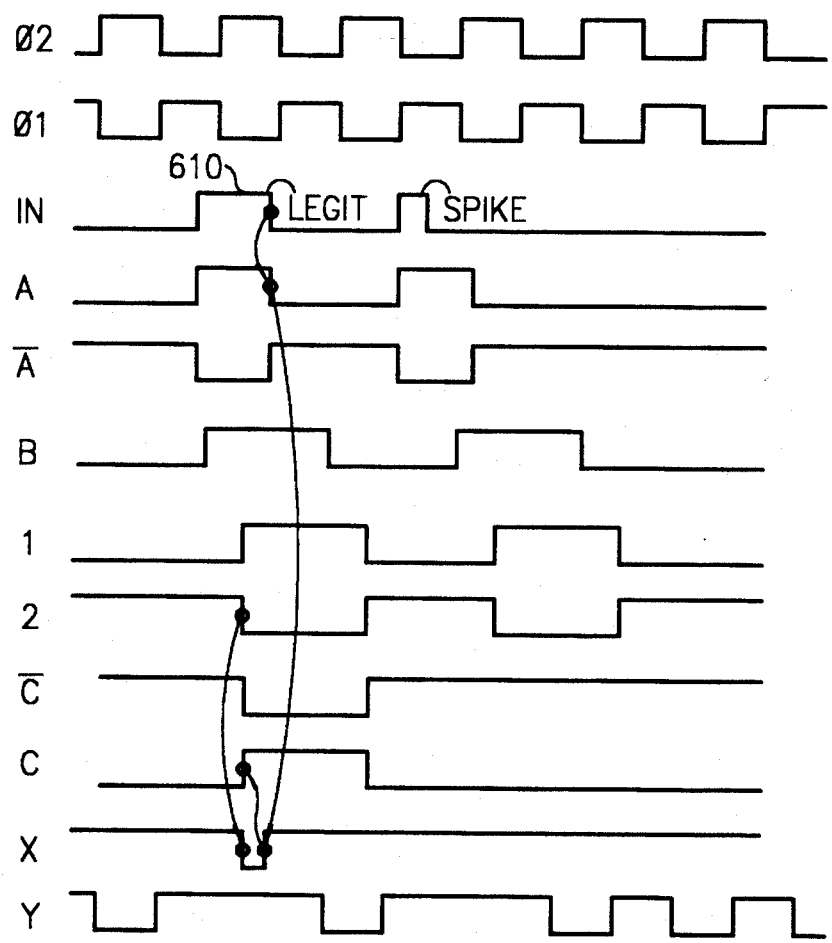
FIG. 6 is a timing diagram illustrating the effect of a ground spike on the logic circuitry of FIG. 5.

FIG. 6 is a timing diagram illustrating the effect of a legitimate signal and a ground spike on the logic circuitry of FIG. 5, according to the invention. Signal waveforms are shown for: the square-wave clock signals Ø1 and Ø2, the system input signal (IN) at terminal 314, the output signal (A) at terminal 330 of the first CMOS clocked latch circuit 312, the inverted output signal (A inverted) at the output terminal of the inverter 520, the output signal (B) at the terminal 350 of the second CMOS clocked latch circuit 332, the signal (1) at the output terminal of the transmission-gate transistor 356, the output signal (2) at terminal 370 of the third CMOS clocked latch circuit 352, the inverted system output signal (C inverted) at terminal 514, the system output signal (C) at terminal 516, the signal (X) at the $\overline{\text{SET}}$ terminal 510 of the RS flip 502, 504, and the signal (Y) at the $\overline{\text{RESET}}$ terminal 512 of the RS flip 502, 504.

A legitimate signal 610 occurs on the input signal IN line and is processed by the system 500, as indicated by the Figure, to provide a properly responsive signal, designated OK, at the C output signal terminal 516.

A spike is shown occurring on the input signal IN line. The spike occurs while the Sample signal Ø2 for the first CMOS clocked latch circuit 312 is HIGH so that the HIGH state of the ground spike is latched in the first CMOS clocked latch circuit 312. As soon as the spike signal rises above the HIGH threshold level at the input terminal of the inverter 320, a signal A with a logic HIGH level is provided at the terminal 330 of the first CMOS clocked latch circuit 312. If the input signal is HIGH when the positive phase of the HOLD signal Ø1 for the first CMOS clocked latch circuit 312 is HIGH, the HIGH state of the spike signal is latched by the first CMOS clocked latch circuit 312. Note that when the next Sample signal Ø2 for the first CMOS clocked latch circuit 312 goes HIGH, the input signal line is at a LOW state, which state is latched into the first CMOS clocked latch circuit 312 and which appears as a LOW state at output terminal 330.

The signal at terminal 330 is sampled by the clock signal Ø1 at terminal 338 of the second CMOS clocked latch circuit 332. The signal at terminal 330 is then latched into the second CMOS clocked latch circuit 332 by the clock signal Ø2 at the HOLD terminal 348 of the second CMOS clocked latch circuit 332.

Finally, the signal at terminal 350 is sampled by the clock signal Ø2 in the third CMOS clocked latch circuit 352. The signal at terminal 350 is then latched into the third CMOS clocked latch circuit 352 by the clock signal Ø1 at the HOLD terminal 368 of the third CMOS clocked latch circuit 352. The signal 1 at the output terminal of the transmission-gate transistor 356 appears in inverted form as signal 2 at terminal 370.

The improved system 500 for synchronizing an interrupt input signal prevents the spike signal on the input signal line from being interpreted and processed as a valid interrupt signal.

Figure 7:
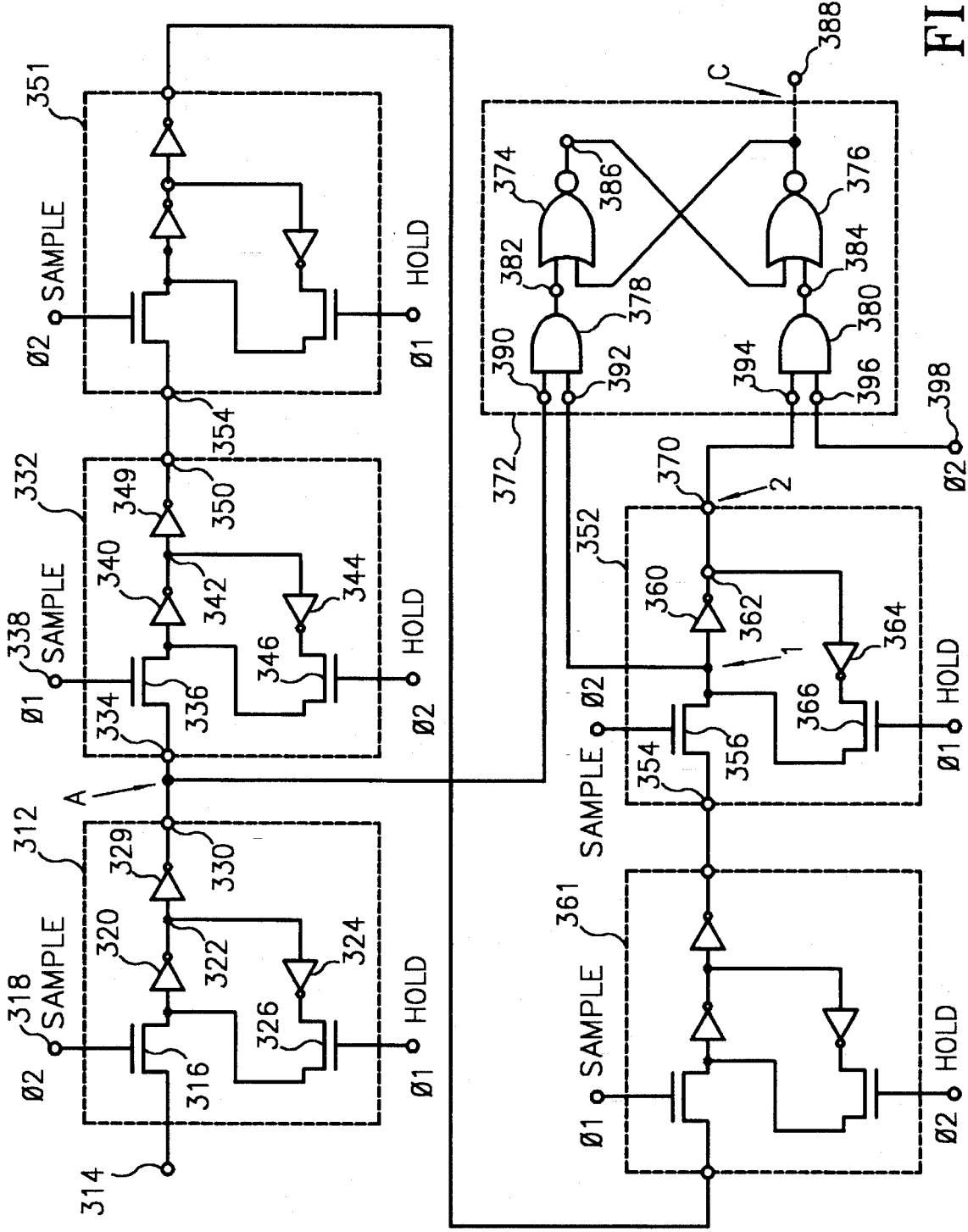
FIG. 7 is a block diagram of an embodiment of logic circuitry similar to the circuitry of FIG. 3, where this logic circuitry cannot be triggered by a ground spike with a duration less than 1.5 clock periods of the computer system to be interrupted.

FIG. 7 shows an embodiment of logic circuitry 700 similar to the circuitry of FIG. 3 for synchronizing an interrupt input signal. This circuit is not triggered by a spike having a duration of less than 1.5 clock periods of the computer system being interrupted. Additional CMOS clocked latch circuits 351 and 361 are connected in series between the output terminal 350 of the CMOS clocked latch circuit 332 and the input terminal 354 of the clocked latch circuit 352. These additional CMOS clocked latch circuits 351 and 361 provide a less than 1.5 clock period spike width protection which is 1.0 clock period greater than that provided by FIG. 3. So, for each pair of CMOS clocked latch circuits added, the added width of spike protection goes up by 1.0 clock period. By adding pairs of clocked latch circuits, one can protect against any spike width.

Figure 8:
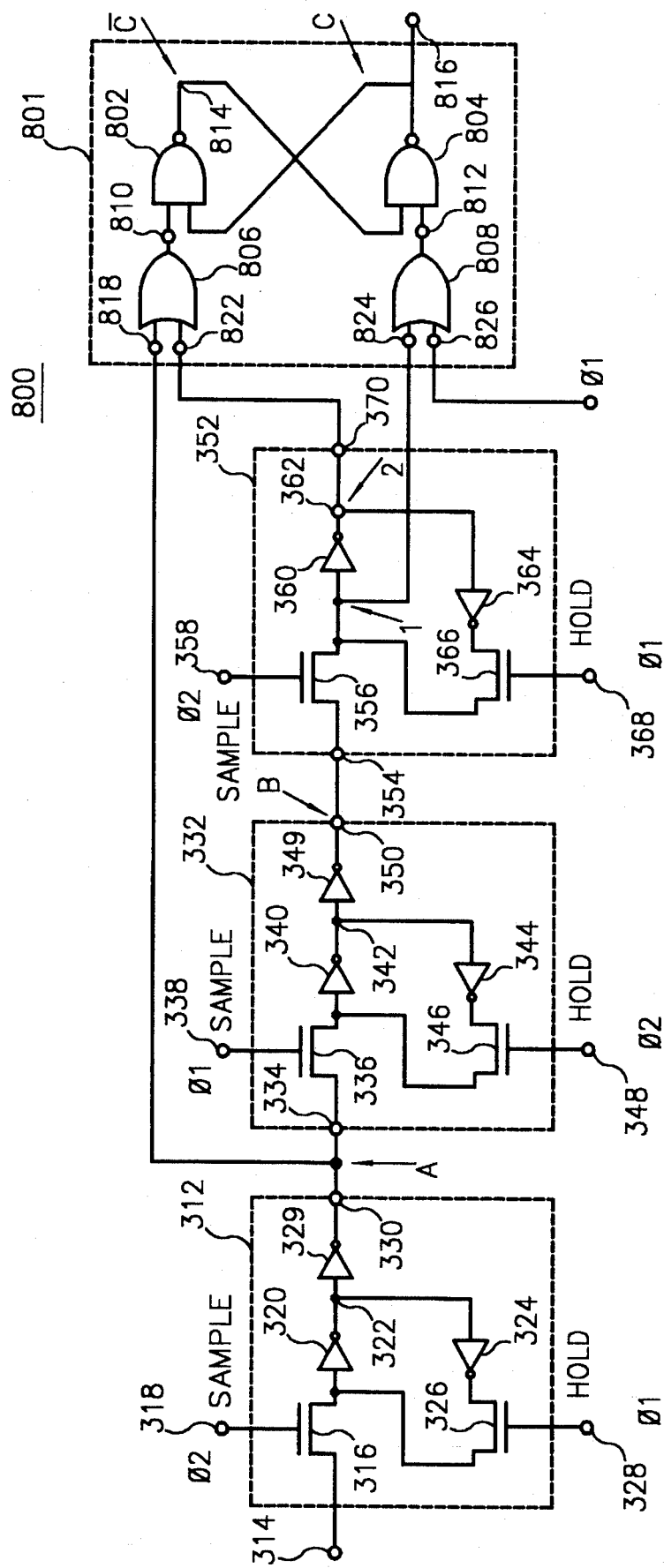
FIG. 8 is a block diagram of logic circuitry for synchronizing an interrupt input signal according to the invention which rejects short-duration negative-going spikes or glitches on the interrupt input signal line.

FIG. 8 is a block diagram of logic circuitry 800 which protects against negative-going spikes or glitches on the interrupt input signal line. This circuit uses an RS flip-flop formed of cross-coupled NAND gates for synchronizing an interrupt input signal and can discriminate against short-duration negative-going spikes or glitches on the interrupt input signal line. The system 800 includes an RS flip-flop circuit which is formed of a pair of cross-coupled NAND gates. Note that setting this flip-flop in this implementation means the output C goes to zero.

FIG. 8 shows logic circuit 800 which includes the first, second, and third CMOS clocked latch circuits 312, 332, 352, which are the same as the latch circuits of FIG. 3. The logic circuit 800 also includes an alternative RS flip-flop latch circuit formed of a pair of cross-coupled NAND gates 802, 804. $\overline{\text{RESET}}$ logic circuit is provided by an OR gate 808. A $\overline{\text{SET}}$ logic circuit is provided by an OR gate 806. The RS flip-flop circuit has a $\overline{\text{RESET}}$ input terminal 812 which is connected to the output terminal of the OR gate 808. The RS flip-flop circuit has a $\overline{\text{SET}}$ input terminal 810 which is connected to the output terminal of the OR gate 806. The RS flip-flop latch circuit includes an INVERTED OUTPUT terminal 814 and an OUTPUT terminal 816.

The OR gate 806 has first input terminal 818 connected to the output terminal of the first CMOS clocked latch circuit 312. The OR gate 806 has a second input terminal 822 which is connected to the signal 2 terminal of the third CMOS clocked latch circuit 352.

The OR gate 808 has first input terminal 824 connected to the signal 1 output terminal the third CMOS clocked latch circuit 352. The OR gate 808 has a second input terminal 826 which is connected to the Ø1 clock signal.

For the latch 802, 804 to be put into the SET state such that the C terminal 816 goes to a LOW state, the $\overline{SET}$ input terminal 810 has to go LOW. $\overline{SET}$ input terminal 810 goes LOW when both input terminals, 818 and 822, to the $\overline{SET}$ OR gate 806, both go LOW. This does not occur when the negative spike width is less than 0.5 clock period of the computer system being interrupted. This prevents a short-duration spike on the input signal line from being interpreted and processed as a valid interrupt signal.

For the latch 802, 804 to be put into the RESET state, such that the C terminal 816 goes to a HIGH state, the $\overline{RESET}$ input terminal 812 has to go LOW. $\overline{RESET}$ input terminal 812 goes low when both input terminals, 824 and 826, to the $\overline{RESET}$ OR gate 808, both go LOW.

Figure 9:
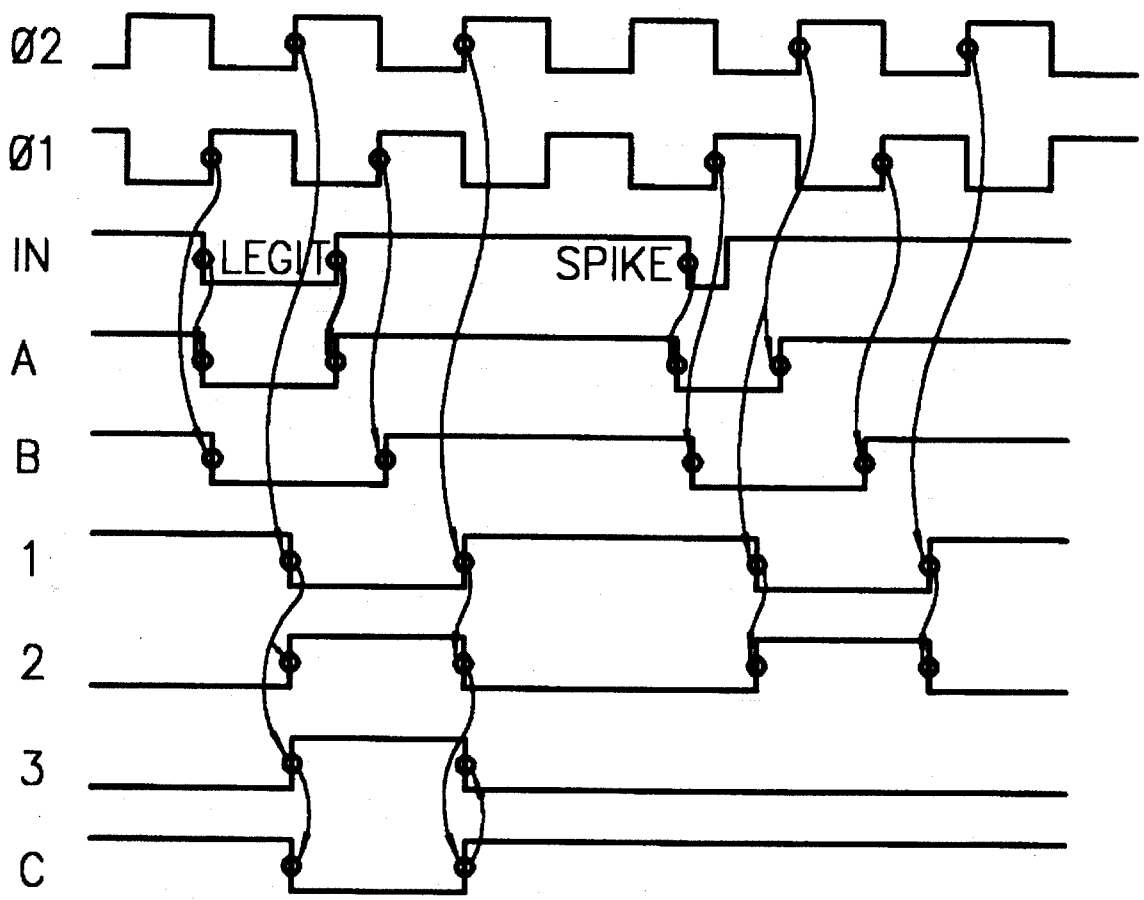
FIG. 9 is a timing diagram illustrating the effect of legitimate interrupt signals and the effect of negative-going spikes or glitches on the interrupt input signal line of the circuit of FIG. 8.

FIG. 9 is a timing diagram illustrating the effect of a legitimate signal and a signal spike on the logic circuitry of FIG. 8, according to the invention. Signal waveforms are shown for: the square-wave clock signals Ø1 and Ø2, the system input signal (IN) at terminal 314, the output signal (A) at terminal 330 of the first CMOS clocked latch circuit 312, the output signal (B) at the terminal 350 of the second CMOS clocked latch circuit 332, the signal (1) at the output terminal of the transmission-gate transistor 356, tile output signal (2) at terminal 370 of the third CMOS clocked latch circuit 352, and the system output signal (C) at terminal 816.

A legitimate signal occurs on the input signal IN line and is processed by the system 800, as indicated by the Figure, to provide a properly responsive signal at the C output signal terminal 516.

A signal spike is shown occurring on the input signal IN line. The signal spike occurs while the sample signal Ø2 for the first CMOS clocked latch circuit 312 is HIGH so that the HIGH state of the ground spike is latched in the first CMOS clocked latch circuit 312. As soon as the spike signal goes below the low threshold level at the input terminal of the inverter 320, a signal A with a logic LOW level is provided at the terminal 330 of the first CMOS clocked latch circuit 312. If the input signal is LOW when the positive phase of the HOLD signal Ø1 for the first CMOS clocked latch circuit 312 is HIGH, the LOW state of the spike signal is latched by the first CMOS clocked latch circuit 312. Note that when the next Sample signal Ø2 for the first CMOS clocked latch circuit 312 goes HIGH, the input signal line is at a HIGH state, which state is latched into the first CMOS clocked latch circuit 312 and which appears as a HIGH 1 state at output terminal 330.

Figure 10:
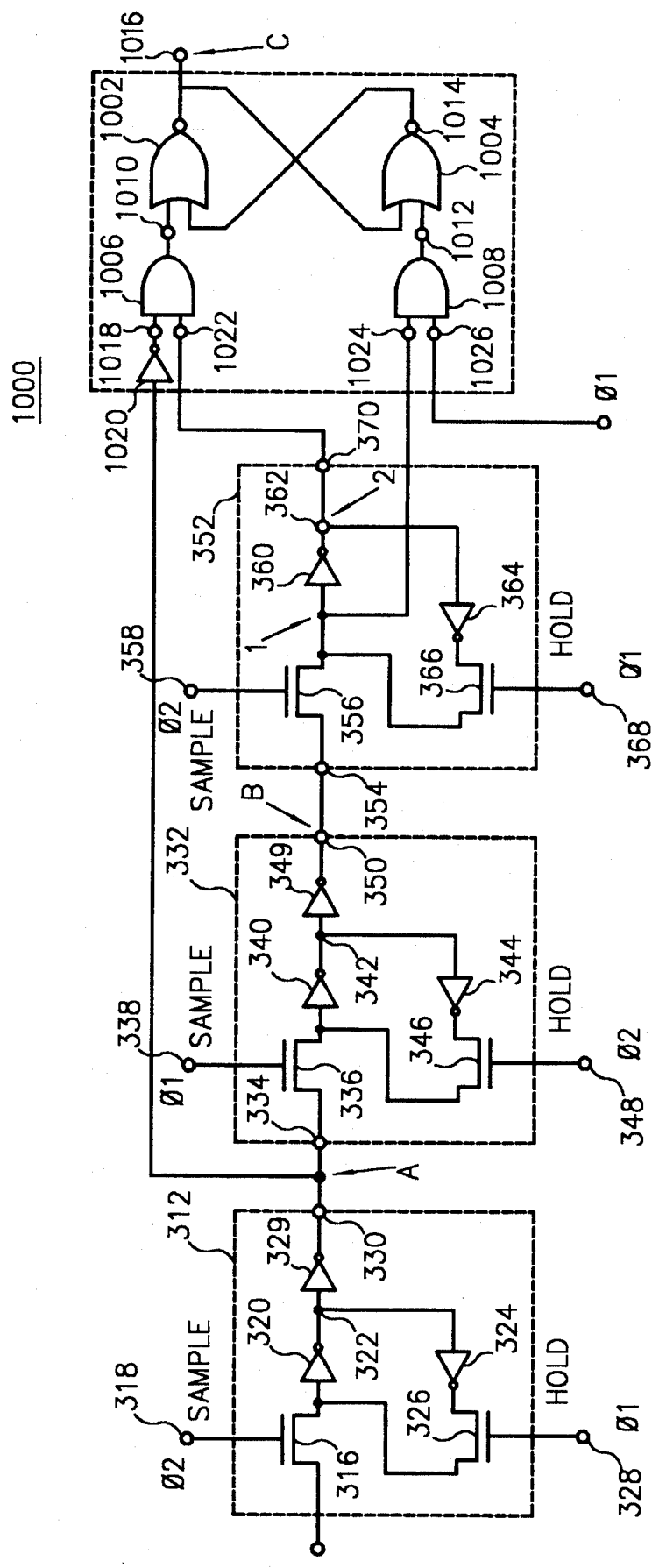
FIG. 10 is a block diagram of an alternative embodiment of logic circuitry which uses an RS flip-flop formed of cross-coupled NOR gates for synchronizing an interrupt input signal according to the invention which rejects short-duration negative-going spikes or glitches on the interrupt signal line.

FIG. 10 is a block diagram of an alterative embodiment of logic circuitry 1000 for synchronizing an interrupt input signal where the input signal line has negative going spikes or glitches on the interrupt input signal line, according to the invention. The system 1000 includes an RS flip-flop circuit which is formed of a pair of cross-coupled NOR gates for synchronizing an interrupt input signal, according to the invention.

FIG. 10 shows the logic circuitry 1000 which includes the first, second, and third CMOS clocked latch circuits 312, 332, 352, which are the same as the latch circuits of FIG. 3. The logic circuitry 1000 also includes an alternative RS flip-flop latch circuit formed of a pair of cross-coupled NOR gates 1002, 1004. A set logic circuit is provided by an AND gate 1006. A reset logic circuit is provided by an AND gate 1008. The RS flip-flop circuit has a SET input terminal 1010 which is connected to the output terminal of the AND gate 1006. The RS flip-flop circuit has a RESET input terminal 1012 which is connected to the output terminal of the AND gate 1008. The RS flip-flop latch circuit includes an INVERTED OUTPUT terminal 1014 and an OUTPUT terminal 1016.

The AND gate 1006 has first input terminal 1018 which is connected through an inverter 1020 to the "A" signal output terminal of the first CMOS clocked latch circuit 312. The AND gate 1006 has a second input terminal 1022 which is connected to the "2" signal output terminal of the third CMOS clocked latch circuit 352.

The AND gate 1008 has first input terminal 1024 connected to the "1" signal terminal of the first transmission-gate transistor 356 of the third CMOS clocked latch circuit 352. The AND gate 1008 has a second input terminal 1026 which is connected to Ø1 clock signal.

For the latch 1002, 1004 to be put into the SET state such that the C terminal 1016 goes to a LOW state, the SET input terminal 1010 has to go HIGH. SET input terminal 1010 goes HIGH when both input terminals, 1018 and 1022, to the SET AND gate 1006, both go HIGH. This does not occur when the negative spike width is less than 0.5 clock period of the computer system being interrupted. This prevents a short-duration spike on the input signal line from being interpreted and processed as a valid interrupt signal.

For the latch 1002, 1004 to be put into the RESET state, such that the C terminal 1016 goes to a HIGH state, the reset input terminal 1012 has to go HIGH. Reset input terminal 1012 goes HIGH when both input terminals, 1024 and 1026, to the reset AND gate 1008, both go HIGH.

Figure 11:
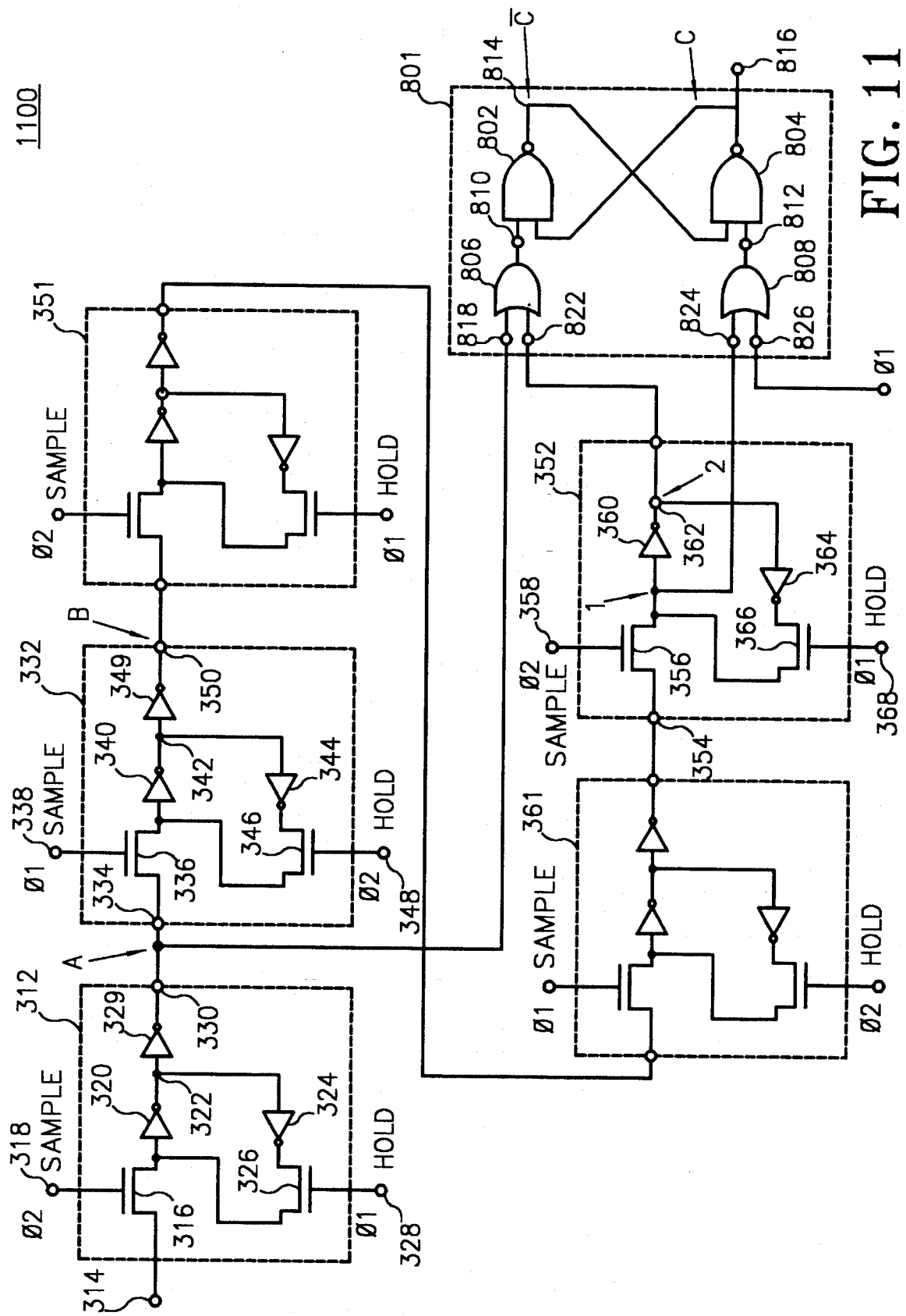
FIG. 11 is a block diagram of an embodiment of logic circuitry similar to FIG. 8 for synchronizing an interrupt input signal where the logic circuit cannot be triggered by a ground spike which has a duration of less than 1.5 clock periods of the computer system to be interrupted.

FIG. 11 is a block diagram of an embodiment of logic circuitry 1100 similar to FIG. 8 for synchronizing an interrupt input signal. This circuit is not triggered by a spike having a duration of less than 1.5 clock periods of the computer system being interrupted. Additional CMOS clocked latch circuits 351 and 361 are connected in series between the output terminal 350 of the CMOS clocked latch circuit 332 and the input terminal 354 of the clocked latch circuit 352. These additional CMOS clocked latch circuits 351 and 361 provide a less than 1.5 clock period spike width protection which is 1.0 clock period greater than that provided by FIG. 8. So for each pair of CMOS clocked latch circuits added, the added width of spike protection goes up by 1.0 clock period. By adding pairs of clocked latch circuits, one can protect against any negative spike width.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A circuit for qualifying and synchronizing an interrupt signal, comprising:

a clock signal source, having a first output terminal at which is provided a first clock signal having a first phase and having a second output terminal at which is provided a second clock signal having a phase opposite to the phase of the first clock signal;

synchronizing means for synchronizing an asynchronous interrupt signal to a synchronous clock signal, said synchronizing means including an input terminal at which is provided the asynchronous interrupt signal, said synchronizing means including clock input terminals connected to the clock output terminals at which are provided complementary synchronous clock signals, said synchronizing means having output terminal for providing predetermined signals;

wherein said synchronizing means includes a plurality of latch subsystems, each of said latch subsystems having a sample input terminal for receiving a synchronous clock signal and a hold terminal for receiving a complementary synchronous clock signal;

a first latch subsystem, including:
  a latch input terminal
  a first transmission gate, having an input terminal connected to the latch input terminal coupled to said input terminal of said synchronizing means, having an output terminal, and having a control terminal connected to the first output terminal of the clock signal source;
  a first series inverter having an input terminal connected to the output terminal of the first transmission gate and having an output terminal;
  a second feedback inverter having an input terminal connected to the output terminal of the first series inverter and having an output terminal;
  a second transmission gate having an input terminal connected to the output terminal of the second feedback inverter and having an output terminal connected to the input terminal of the first series inverter, and having a control terminal connected to the second output terminal of the clock signal source;
  a second series inverter having an input terminal connected to the output terminal of the first series inverter and having an output terminal;

a second latch subsystem, including:
  a latch input terminal coupled to said output terminal of said second series inverter of said first latch subsystem
  a first transmission gate, having an input terminal connected to the latch input terminal, having an output terminal, and having a control terminal connected to the second output terminal of the clock signal source;
  a first series inverter having an input terminal connected to the first transmission gate output terminal and having an output terminal;
  a second feedback inverter having an input terminal connected to the output terminal of the first series inverter and having an output terminal;
  a second transmission gate having an input terminal connected to the output terminal of the second feedback inverter and having an output terminal connected to the input terminal of the first series inverter, and having a control terminal connected to the first output terminal of the clock signal source;
  a second series inverter having an input terminal connected to the output terminal of the first series inverter and having an output terminal;

a third latch subsystem, including:
  a latch input terminal coupled to said output terminal of said second series inverter of said second latch subsystem
  a first transmission gate, having an input terminal connected to the latch input terminal, having an output terminal, and having a control terminal connected to the first output terminal of the clock signal source;
  a first series inverter having an input terminal connected to the first transmission gate output terminal and having an output terminal;
  a second feedback inverter having an input terminal connected to the output terminal of the first series inverter and having an output terminal;
  a second transmission gate having an input terminal connected to the output terminal of the second feedback inverter and having an output terminal connected to the input terminal of the first series inverter, and having a control terminal connected to the second output terminal of the clock signal source;

a RS flip-flop circuit having a set input terminal, a RESET input terminal, an inverted OUTPUT terminal; and an OUTPUT terminal;

set logic means, including input terminals for receiving predetermined signals from the synchronizing means, for generating a set output signal at an output terminal thereof in response to certain ones of said predetermined signals having a predetermined relationship therebetween indicative of an input interrupt signal having a duration greater than 1.5 periods of the synchronous clock signal and to provide protection against interrupt signals less than 0.5 clock periods with a legitimate input signal having a minimum width greater than 1.5 clock periods;

reset logic means, including input terminals for receiving predetermined signals from the synchronizing means, for generating a reset output signal at an output terminal thereof in response to other ones of said predetermined signals having a predetermined relationship therebetween;

wherein the interrupt signal is a positive pulse;

wherein the a RS flip-flop circuit includes a pair of cross-coupled NOR gates;

wherein the set logic means includes a first AND gate, having a first input terminal connected to the output terminal of the second series inverter of the first latch subsystem, said first AND gate having a second input terminal connected to the output terminal of the first transmission gate of the third latch subsystem; said first AND gate having an output terminal connected to the SET terminal of the RS flip-flop circuit; and wherein the reset logic means includes a second AND gate, having a first input terminal connected to the output terminal of the first series inverter of the third latch subsystem, said second AND gate having a second input terminal with the first clock signal applied thereto; said second AND gate having an output terminal connected to the RESET terminal of the RS flip-flop circuit.

2. The circuit of claim 1 including at least two additional latch subsystem in series with the first and second latch subsystems to provide protection against interrupt signals less than 1.5 clock periods with a legitimate input signal having a minimum width greater than 2.5 clock periods.

3. A circuit for qualifying and synchronizing an interrupt signal, comprising:

a clock signal source, having a first output terminal at which is provided a first clock signal having a first phase and having a second output terminal at which is provided a second clock signal having a phase opposite to the phase of the first clock signal;

synchronizing means for synchronizing an asynchronous interrupt signal to a synchronous clock signal, said synchronizing means including an input terminal at which is provided the asynchronous interrupt signal, said synchronizing means including clock input terminals connected to the clock output terminals at which are provided complementary synchronous clock signals said synchronizing means having output terminal for providing predetermined signals;

wherein said synchronizing means includes a plurality of latch subsystems, each of said latch subsystems having a sample input terminal for receiving a synchronous clock signal and a hold terminal for receiving a complementary synchronous clock signal;

a first latch subsystem, including:
  a latch input terminal coupled to said input terminal of said synchronizing means
  a first transmission gate, having an input terminal connected to the latch input terminal, having an output terminal, and having a control terminal connected to the first output terminal of the clock signal source;
  a first series inverter having an input terminal connected to the output terminal of the first transmission gate and having an output terminal;
  a second feedback inverter having an input terminal connected to the output terminal of the first series inverter and having an output terminal;
  a second transmission gate having an input terminal connected to the output terminal of the second feedback inverter and having an output terminal connected to the input terminal of the first series inverter, and having a control terminal connected to the second output terminal of the clock signal source;
  a second series inverter having an input terminal connected to the output terminal of the first series inverter and having an output terminal;

a second latch subsystem, including:
  a latch input terminal coupled to said output terminal of said second series inverter of said first latch subsystem
  a first transmission gate, having an input terminal connected to the latch input terminal, having an output terminal, and having a control terminal connected to the second output terminal of the clock signal source;
  a first series inverter having an input terminal connected to the first transmission gate output terminal and having an output terminal;
  a second feedback inverter having an input terminal connected to the output terminal of the first series inverter and having an output terminal;
  a second transmission gate having an input terminal connected to the output terminal of the second feedback inverter and having an output terminal connected to the input terminal of the first series inverter, and having a control terminal connected to the first output terminal of the clock signal source;
  a second series inverter having an input terminal connected to the output terminal of the first series inverter and having an output terminal;

a third latch subsystem, including:
  a latch input terminal; coupled to said output terminal of said second series inverter of said second latch subsystem
  a first transmission gate, having an input terminal connected to the latch input terminal, having an output terminal, and having a control terminal connected to the first output terminal of the clock signal source;
  a first series inverter having an input terminal connected to the first transmission gate output terminal and having an output terminal;
  a second feedback inverter having an input terminal connected to the output terminal of the first series inverter and having an output terminal;
  a second transmission gate having an input terminal connected to the output terminal of the second feedback inverter and having an output terminal connected to the input terminal of the first series inverter, and having a control terminal connected to the second output terminal of the clock signal source;

a RS flip-flop circuit having a SET/input terminal, a RESET/input terminal, an inverted OUTPUT terminal; and an OUTPUT terminal;

set logic means, including input terminals for receiving predetermined signals from the synchronizing means, for generating a set output signal at an output terminal thereof in response to certain ones of said predetermined signals having a predetermined relationship therebetween indicative of an input interrupt signal having a duration greater than 1.5 periods of the synchronous clock signal and to provide protection against interrupt signals less than 0.5 clock periods with a legitimate input signal having a minimum width greater than 1.5 clock periods;

reset logic means, including input terminals for receiving predetermined signals from the synchronizing means, for generating a reset output signal at an output terminal thereof in response to other ones of said predetermined signals having a predetermined relationship therebetween;

wherein the interrupt signal is a negative pulse;

wherein the a RS flip-flop circuit includes a pair of cross-coupled NAND gates;

wherein the set logic means includes a first OR gate, having a first input terminal connected to the output terminal of said second series inverter of the first latch subsystem, said first OR gate having a second input terminal connected to the output said second feedback inverter terminal of the third latch subsystem; said first OR gate having an output terminal connected to the SET/terminal of the RS flip-flop circuit;

wherein the reset logic means includes a second OR gate, having a first input terminal connected to the output terminal of the first transmission gate of the third latch subsystem, said second OR gate having a second input terminal with the second clock signal applied thereto, said second OR gate having an output terminal connected to the $\overline{\text{RESET}}$ terminal of the RS flip-flop circuit.

4. The circuit of claim 3 including at least two additional latch subsystem in series with the first and second latch subsystems to provide protection against interrupt signals less than 1.5 clock periods with a legitimate input signal having a minimum width greater than 2.5 clock periods.

* * * * *